United States Patent [19]

Moyer

[11] Patent Number: 4,504,427
[45] Date of Patent: Mar. 12, 1985

[54] SOLDER PREFORM STABILIZATION FOR LEAD FRAMES

[75] Inventor: Harold W. Moyer, Allentown, Pa.

[73] Assignee: AT&T Bell Laboratories, Murray Hill, N.J.

[21] Appl. No.: 505,338

[22] Filed: Jun. 17, 1983

[51] Int. Cl.³ .............................................. B29C 6/04
[52] U.S. Cl. ................................. 264/25; 264/272.15; 264/272.17; 264/278; 264/317
[58] Field of Search .................. 264/272.15, 272.17, 264/278, 317; 29/588; 264/25

[56] References Cited

U.S. PATENT DOCUMENTS

| 1,219,629 | 3/1917 | Davenport | 264/278 |
| 3,076,051 | 1/1963 | Haba | 264/278 |
| 3,418,089 | 12/1968 | Berg | 29/588 |
| 3,429,030 | 2/1969 | Bell | 29/588 |
| 3,494,023 | 2/1970 | Dorendorf | 29/588 |
| 3,529,054 | 9/1970 | Hepner | 264/317 |
| 3,810,300 | 5/1974 | Hulmes et al. | 29/588 |
| 4,137,546 | 1/1979 | Frusco | 29/588 |

OTHER PUBLICATIONS

*Electronic Packaging and Production,* "Solder Coating and Leveling Competes with Tin-Lead Electroplate", H. W. Markstein, Dec. 1982, pp. 30–35.

*Primary Examiner*—James Lowe
*Attorney, Agent, or Firm*—Peter V. D. Wilde

[57] ABSTRACT

Fabricating spacer bars or dam bars in conventional lead frames of a low melting material, e.g. solder, permits facile removal of the bar after molding. The low melting bars can be removed by furnace heating, localized radiant energy heating, exposure to rapid thermal annealing (RTA), hot air or hot liquid leveling, etc.

5 Claims, 5 Drawing Figures

SOLDER PREFORM STABILIZATION FOR LEAD FRAMES

BACKGROUND OF THE INVENTION

Metal lead frames used in the production of plastic encapsulated electrical components are usually made with temporary metal bars connected between each adjacent pair of leads. The bars are integral with the lead frame and are referred to by a variety of terms such as tie strips, stabilizer bars, dam bars, spacer bars, etc. They serve usually two functions: they hold the leads in proper spaced relationship during processing and they restrict the outward flow of fluid plastic during the molding operation. Both functions are completed when processing is complete. The bars, which we refer to here as spacer bars, are punched out with a die stamp after the molding operation is complete.

STATEMENT OF THE INVENTION

I propose an alternative to the conventional spacer bars. The alternative is to form the spacer bars from a material different than the material of the lead frame. In a preferred embodiment the material is low melting, allowing it to be selectively removed by heating. An advantageous low melting material is solder. Removal of the spacer bar by heating eliminates the need for the die stamp operation referred to earlier.

DETAILED DESCRIPTION

These and other aspects of the invention will become evident from the following detailed description and the accompanying drawing in which.

Figure 1:
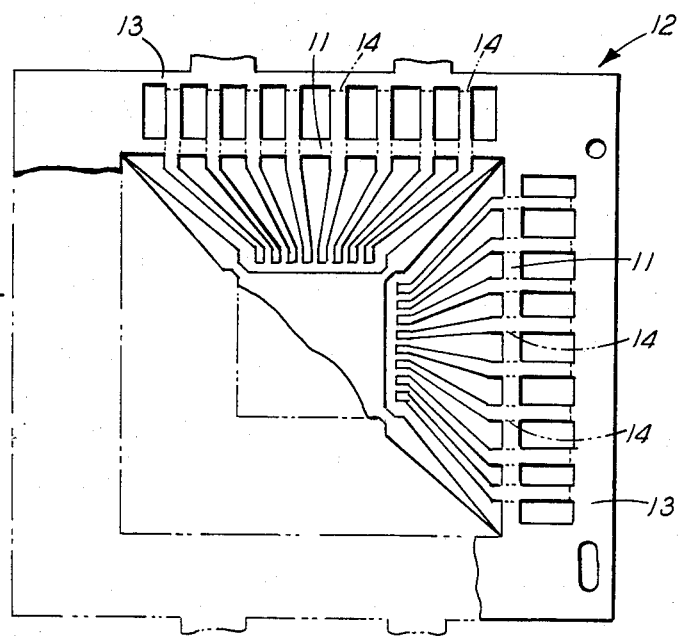
FIG. 1 is a lead frame typical of the prior art with spacer bars integral with the lead frame.

FIG. 1 depicts the conventional approach to lead frame design with spacer bars 11 formed integrally with lead frame 12. After completion of the molding operation, the spacer bars and the frame (13) are removed by severing the bars at the locations indicated by dashed lines 14.

Figure 2A:
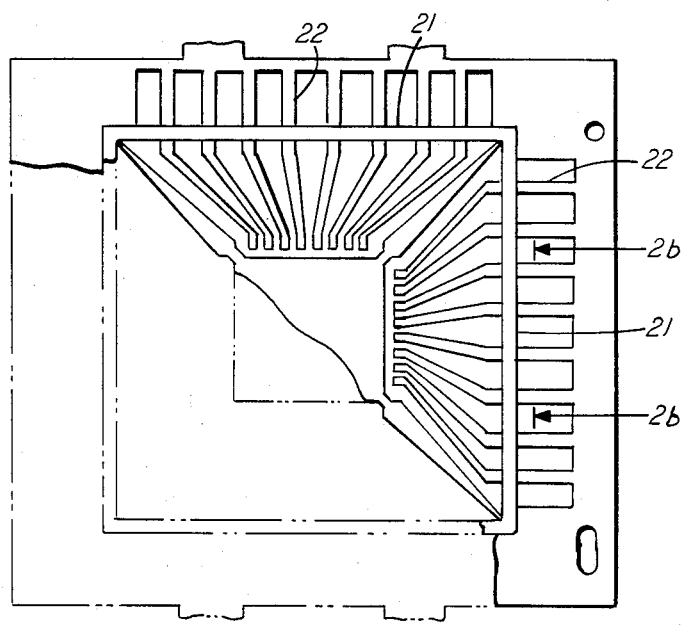
FIGS. 2a and 2b show two exemplary forms of lead frames constructed according to the invention with the spacer bars and the lead frame formed of different materials.
Figure 2B:
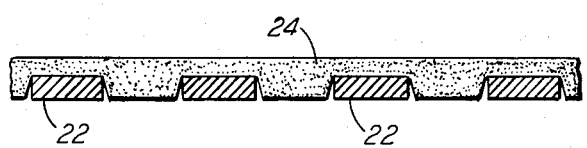
Figure 2C:
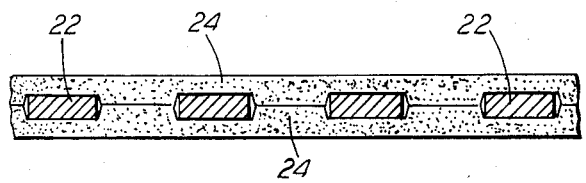

FIGS. 2a, 2b and 2c show the alternative approach of the invention. In FIG. 2a the spacer bars 21, formed from a low melting material such as solder, are shown connected between leads 22. These bars serve effectively as mechanical supports and to restrict the flow of molten plastic during the molding operation. It has been demonstrated that conventional solder (e.g. 60-40) bars maintain their physical integrity during standard molding operations. FIG. 2b shows an arrangement wherein a frame 24 of low melting material such as solder is pressed around the series of leads 22. The frame may be applied with or without heating forming either a cold compression or thermocompression bond. The frame may be applied in two halve-like sections affixed from opposite sides of the series of leads 22, as shown in FIG. 2c, in which case the two sections of the frame 24 and 24[1] weld or otherwise attach together.

Figure 3:
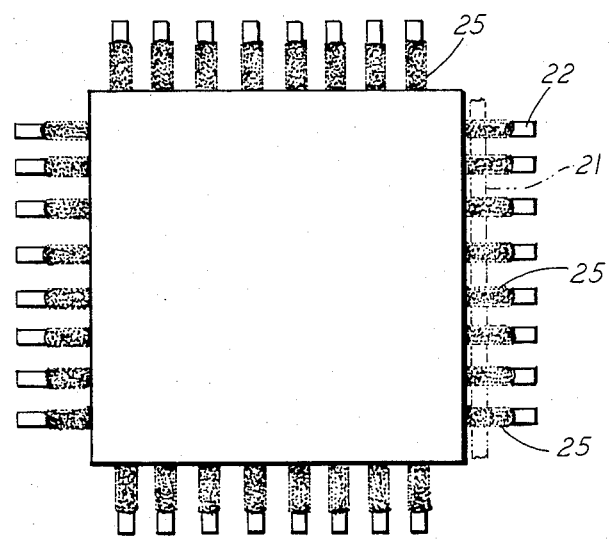

FIG. 3 shows the assembly after application of heat. The spacer bars, shown in phantom at 22, have melted and the material, 25, e.g. solder, may (as shown) or may not adhere to the leads. In some cases it is desirable to "solder coat" the leads to aid in subsequent assembly operations. This solder coating operation can be accomplished conveniently in conjunction with the spacer bar technique as just described. Heat for melting the spacer bars may be applied to the whole part in e.g. a furnace, or may be applied selectively to the bars or the regions of the assembly containing the bars by using a laser, an electron beam or other appropriate directed source of radiant energy. Selective heating allows greater latitude in the choice of the material for the spacer bars, as long as the bar melts preferentially to the adjacent leads. For example the spacer bars may be made from a material with a relatively high melting point but with a surface that couples more energy from the laser beam than the leads 22. Leads 22 are typically specular. It is possible therefore to construct the spacer bars of the same bulk material as the lead frame if the surface of the spacer bars is so modified to couple radiation selectively with respect to the remainder of the lead frame. The term "lower melting" as used herein is intended to include materials that melt preferentially due to a variety energy absorbing effects, as for example anti-reflection coatings, energy absorbing coatings, chemically reactive coatings (e.g. exothermic compound formers). However in each case the spacer bars are designed to melt preferentially with respect to the leads 22. It is to be understood that this is in contrast with conventional laser machining where the laser beam melts material where the beam is directed but there is no inherent selectivity. In the conventional processs the address of the beam must be precisely controlled. According to this invention the beam is scanned over the leads 22 as well as the spacer bars and selectivity is inherent. Alternatively high intensity lamps may be used in the manner of well known rapid thermal annealing processes.

A further alternative is to melt the spacer bars using hot air leveling or hot liquid leveling. (See. H. W. Markstein, Electronic Packaging and Production, December, 1982, pp. 30-35.) Both of these techniques are well known and well developed for applications similar to the one described here, and the former was used to demonstrate the effectiveness of solder spacer bar technology. The hot air knives are effective not only for melting the solder spacer bars but also enhance the solder coating operation mentioned earlier. Similar results can be expected using liquid leveling. Both of the approaches are attractive for packages with small pitch leads. The gas or liquid serves a dual role, i.e. it provides the requisite thermal energy while also imparting a physical scrubbing action that insures removal or distribution of molten material so that secondary bridging does not occur.

Various additional modifications and extensions of this invention will become apparent to those skilled in the art. All such variations and deviations which basically rely on the teachings through which this invention has advanced the art are properly considered to be within the spirit and scope of this invention.

What is claimed is:

1. Method for mold encapsulating an electrical device wherein the device has a plurality of electrical leads arranged to extend beyond the molded encapsulant and wherein a spacer element is applied to the leads to maintain the leads in a desired spatial relationship during the mold encapsulating process the invention characterized in that the spacer element is formed of a material that melts preferentially with respect to the material of the metal leads and the invention further characterized by melting the spacer element without melting the electrical leads or the encapsulant after the mold encapsulating process.

2. The method of claim 1 in which the spacer bars are comprised of solder.

3. The method of claim 1 in which heat is applied by a beam of radiant energy to melt the spacer bars.

4. The method of claim 2 in which the spacer bars are removed by hot air or liquid leveling.

5. The method of claim 1 in which the spacer element is composed of conductive material.

* * * * *